US008861286B2

United States Patent
Yoon et al.

(10) Patent No.: US 8,861,286 B2
(45) Date of Patent: Oct. 14, 2014

(54) VERIFICATION READ DATA OUTPUT CIRCUIT OF A SEMICONDUCTOR DEVICE AND METHOD FOR OPERATING THE SAME

(75) Inventors: Jung Hyuk Yoon, Anyang-si (KR); Dong Keun Kim, Icheon-si (KR)

(73) Assignee: SK Hynix Inc., Icheon-Si (KR)

( * ) Notice: Subject to any disclaimer, the term of this patent is extended or adjusted under 35 U.S.C. 154(b) by 323 days.

(21) Appl. No.: 13/474,653

(22) Filed: May 17, 2012

(65) Prior Publication Data

US 2013/0163348 A1 Jun. 27, 2013

(30) Foreign Application Priority Data

Dec. 27, 2011 (KR) .......................... 10-2011-0143937

(51) Int. Cl.
*G11C 7/10* (2006.01)

(52) U.S. Cl.
USPC ............ 365/189.05; 365/185.22; 365/189.15; 365/191; 365/201

(58) Field of Classification Search
CPC ........ G11C 7/22; G11C 7/106; G11C 7/1051; G11C 7/1057; G11C 7/1078; G11C 11/401
USPC ........... 365/201, 189.05, 185.22, 189.15, 191
See application file for complete search history.

(56) References Cited

U.S. PATENT DOCUMENTS 7,190,625 B2 * 3/2007 Keeth ............................ 365/201

* cited by examiner

*Primary Examiner* — Tha-O H Bui

(57) ABSTRACT

A semiconductor device and a method for operating the same are provided relating to a nonvolatile memory device for sensing data using resistance change. The semiconductor device comprises a verification read control unit configured to sequentially output verification read data received from a sense amplifier into a global input/output line in response to a test signal, and a read data latch unit configured to store sequentially the verification read data received from the global input output line in response to a latch enable signal in activation of the test signal.

18 Claims, 10 Drawing Sheets

VERIFICATION READ DATA OUTPUT CIRCUIT OF A SEMICONDUCTOR DEVICE AND METHOD FOR OPERATING THE SAME

CROSS-REFERENCE TO RELATED APPLICATION

The priority of Korean patent application No. 10-2011-0143937 filed on Dec. 27, 2011 the disclosure of which is hereby incorporated in its entirety by reference, is claimed.

BACKGROUND OF THE INVENTION

The present invention relates generally to a semiconductor device and a method operating the same, and more specifically, to a technology related to a nonvolatile memory device for sensing data using resistance change.

Generally, memory devices may be classified as a volatile memory device or a nonvolatile memory device. A nonvolatile memory device includes a nonvolatile memory cell capable of preserving stored data even when a power source is off. For example, a nonvolatile memory device may be implemented as a flash random access memory (RAM) device, a phase change RAM (PCRAM) device, or the like.

A PCRAM device includes memory cells that are implemented using a phase change material, for example, germanium antimony tellurium (GST), and is configured to store data in the memory cells by applying heat to the GST so that the GST changes into a crystal or amorphous phase.

A nonvolatile memory device, such as a magnetic memory device, a phase change memory (PCM) device, or the like, has a data processing speed similar to that of a volatile RAM device. A nonvolatile memory device also preserves data even when a power source is off.

FIGS. 1a and 1b illustrates a conventional phase change resistance device 4.

Referring to FIGS. 1a and 1b, the phase change resistance device 4 includes an upper electrode 1, a lower electrode 3, and a phase change material 2 interposed between the upper electrode 1 and the lower electrode 3. When a voltage is applied to the upper electrode 1 and the lower electrode 3, a current flows into the phase change material 2, and thus a high temperature is induced in the phase change material 2. The electrical conductive state of the phase change material 2 changes depending on resistance variation due to the high temperature.

FIGS. 2a and 2b illustrates a data storage principle of the conventional phase change resistance device 4.

Referring to FIG. 2a, when a current below a critical value flows into the phase change resistance device 4, the phase change material 2 is crystallized. When the phase change material 2 changes into a crystal phase, it becomes a low resistance material. As a result, a current can flow between the upper electrode 1 and the lower electrode 3.

On the other hand, referring to FIG. 2b, when a current over the critical value flows into the phase change resistance device 4, the temperature of the phase change material 2 increases to over a melting point. When the phase change material 2 melts into an amorphous phase, it becomes a high resistance material. As a result, a current cannot easily flow between the upper electrode 1 and the lower electrode 3.

As described above, the phase change resistance device 4 can store data corresponding to two resistance phases. For example, in the phase change resistance device 4, the low resistance phase may correspond to data "1" and the high resistance phase may correspond to data "0."

Also, this data can be stored in the phase change resistance device 4 as nonvolatile data because the status of the phase change resistance material 2 does not change even when a power source is off.

FIG. 3 illustrates a write operation of a conventional phase change resistance cell.

Referring to FIG. 3, heat is generated if a current flows between the upper electrode 1 and the lower electrode 3 of the phase change resistance device 4 for a given time.

When a current below the critical value flows for a given time, the phase change material 2 changes into a crystalline phase formed by a low temperature heating status. As a result, the phase change resistance device 4 becomes a low resistance element with a set phase.

On the other hand, when a current over the critical value flows for a given time, the phase change material 2 changes into an amorphous phase formed by a high temperature heating status. As a result, the phase change resistance device 4 becomes a high resistance element having with a reset phase.

By using the properties described above, a low voltage may be applied to the phase change resistance device 4 for a long time in order to write the set phase in the write operation.

On the other hand, a high voltage may be applied to the phase change resistance device 4 for a short time in order to write the reset phase in the write operation.

In a sensing operation, a phase change resistance memory applies a sensing current to the phase change resistance device 4 to sense data written in the phase change resistance device 4.

Meanwhile, this nonvolatile memory device performs a verification read operation for judging whether a desired resistance is obtained so as to determine whether a program operation is continuously performed or not.

However, when the program operation and the verification read operation are accurately performed in an actual test operation, it is difficult to determine whether there is a problem in the verification read operation or the program operation. If it is possible to figure out a verification read value, it is easy to determine the cause of the problem.

FIG. 4 illustrates an operational timing diagram of a read operation in a conventional nonvolatile memory device.

Generally, a program and verify read (PNV) operation includes a verification read operation that is performed before performing a program operation so as to compare data written in a current cell with data to be written in the current cell.

If the data written in the current cell is identical to the data to be written, a program flag signal is disabled indicating to a program state machine (PSM) not perform the program operation.

On the other hand, if the data written in the current cell is different from the data to be written, the program flag signal is enabled. The enabled program flag signal is sent to the PSM to perform the program operation.

Each of output data S/A<0>~S/A<X> sensed by a sense amplifier is outputted to a read global input/output line RGIO. In a normal read operation, when latch enable signals LEN<0>~LEN<X> are sequentially enabled, read data is sequentially latched in data latches D_Lat<0>~D_Lat<X>.

However, in this conventional nonvolatile memory device, the output data S/A<0>~S/A<X> are sequentially stored in the data latches D_Lat<0>~D_Lat<X> but it is difficult to find out a data value read in the verification read operation.

When defects are generated in actual program and verification read operations, it is impossible to determine whether a cause of the defects results from the program operation or the verification operation. Moreover, it is difficult to distinguish the normal read operation from the verification read operation.

BRIEF SUMMARY OF THE INVENTION

Various embodiments of the present invention are directed to providing a semiconductor device that may enable a user to determine a cause of defects generated in program and verification operations by using a test mode so as to output a data value and distinguish a verification read data value. If several verification read operations are performed, verification read data outputted from one sense amplifier are sequentially stored in a read data latch unit and outputted so that the user can read desired verification read data using an external device.

According to an embodiment of the present invention, a semiconductor device comprises: a verification read control unit configured to output sequentially verification read data received from a sense amplifier into a global input/output line in response to a test signal; and a read data latch unit configured to store sequentially the verification read data received from the global input/output line in response to a latch enable signal in activation of the test signal.

The verification read control unit comprises: a test control unit configured to output selectively the verification read data received from the sense amplifier depending on activation of the test signal; a read data control unit configured to output the verification read data into the global input output line during the activation period of the test signal; and a latch control unit configured to output sequentially the latch enable signals during the activation period of the test signal.

The test control unit is configured to output the verification read data into the read data control unit regardless of activation of a program enable signal in the activation of the test signal.

The read data control unit is configured to output sequentially a plurality of verification read data received from one sense amplifier into the global input/output line.

The read data control unit comprises: a selection switching unit configured to select one of a plurality of verification read data depending on a write address during the activation period of the test signal; and a driving unit configured to output sequentially output data of the selection switching unit into the global input/output line in synchronization with a plurality of enable signals which are sequentially activated.

The semiconductor device further comprises an enable signal generating unit configured to supply the plurality of enable signals to the read data control unit.

The enable signal generating unit comprises: a pulse generating unit configured to generate a clock with a given cycle; an up-counter configured to perform an up-count operation in synchronization with the clock; and a decoder configured to decode an output signal of the up-counter to generate the plurality of enable signals.

The latch control unit is configured to output sequentially the latch enable signals in synchronization with the point when the verification read data is outputted into the global input output line.

The read data latch unit is configured to output data stored depending on a read command into a data output unit.

The test control unit comprises: a test signal input unit configured to enable a switching signal regardless of activation of the program enable signal in activation of the test signal; and a switching unit configured to output the verification read data into the read data control unit when the switching signal is enabled.

According to another embodiment of the present invention, a method for sensing a semiconductor device comprises: verifying data applied to a sense amplifier to output verification read data; outputting the verification read data into a global input/output line during an activation period of a test signal; and storing sequentially the verification read data applied to the global input/output line into a read data latch unit in response to a latch enable signal during the activation period of the test signal.

The method further comprises outputting data stored in the read data latch unit into a data output unit depending on a read command.

The verification read data is outputted into the global input/output line regardless of activation of a program enable signal in activation of the test signal.

A plurality of verification read data received from one sense amplifier are sequentially outputted into the global input/output line in activation of the test signal.

The method further comprises: selecting one of the plurality of verification read data depending on a write address during an activation period of the test signal; and sensing the selected verification read data in synchronization with a plurality of sequentially activated enable signals to output sequentially data into the global input/output line.

The method further comprises: generating a clock with a given cycle; and performing an up-count operation in synchronization with the clock; and decoding an output signal of the up-counter to generate the plurality of enable signals.

The latch enable signals are sequentially activated in synchronization with the point when the verification read data is outputted into the global input/output line.

The outputting of the verification read data into the global input/output line comprises: enabling a switching signal regardless of activation of a program enable signal in activation of the test signal; and outputting the verification read data into the global input/output line when the switching signal is enabled.

DESCRIPTION OF EMBODIMENTS

Exemplary embodiments of the present invention will be described in detail with reference to the attached drawings.

Figure 1A:
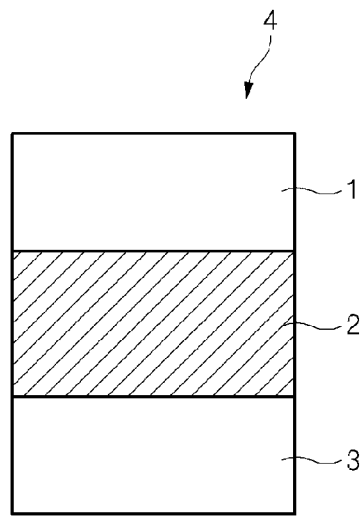
FIGS. 1a and 1b illustrate a conventional phase change resistance device.
Figure 1B:
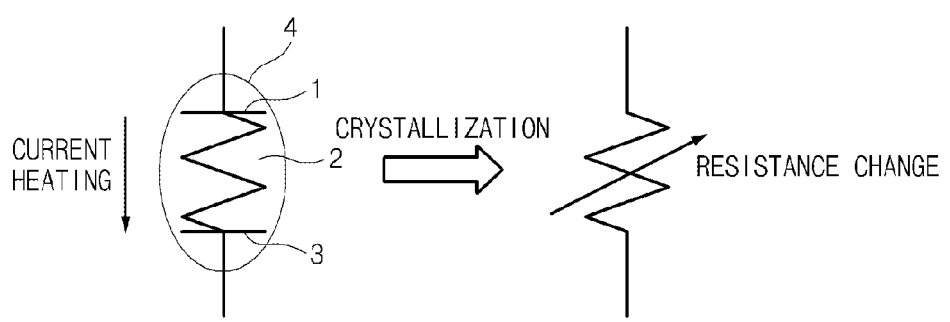
Figure 2A:
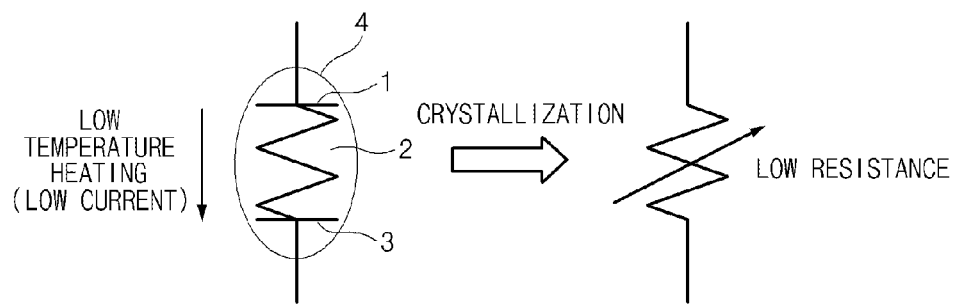
FIGS. 2a and 2b illustrate a data storage principle of the conventional phase change resistance device.
Figure 2B:
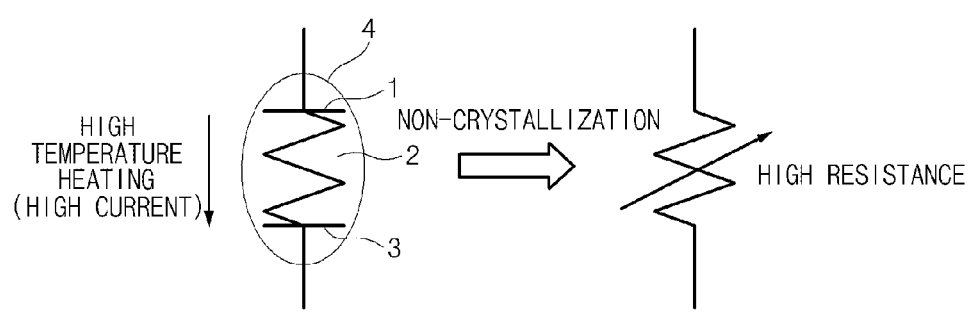
Figure 3:
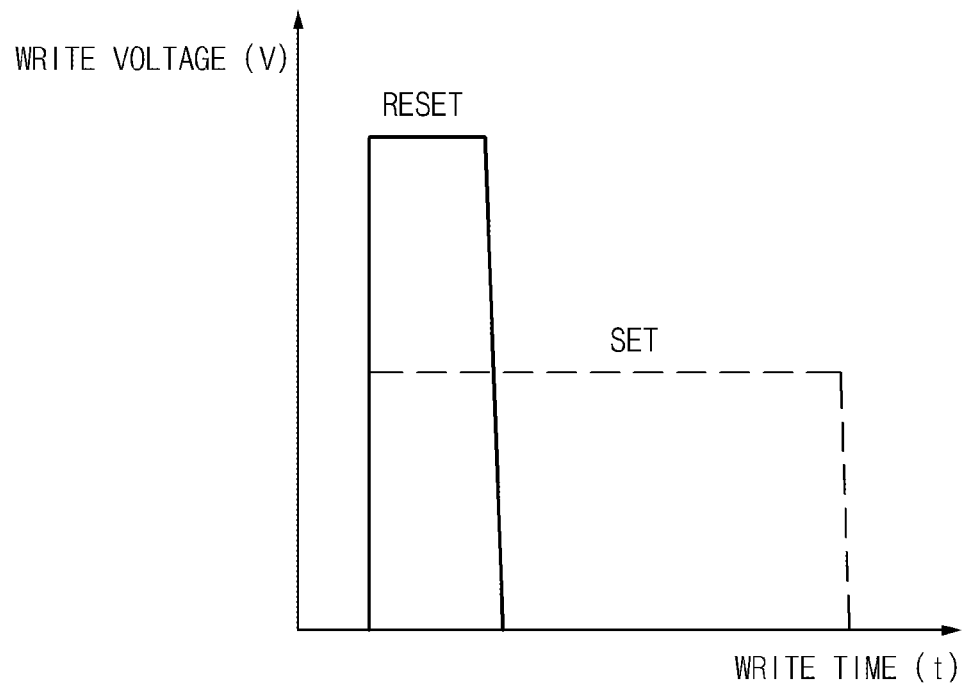
FIG. 3 illustrates a write operation in a conventional phase change resistance cell.
Figure 4:
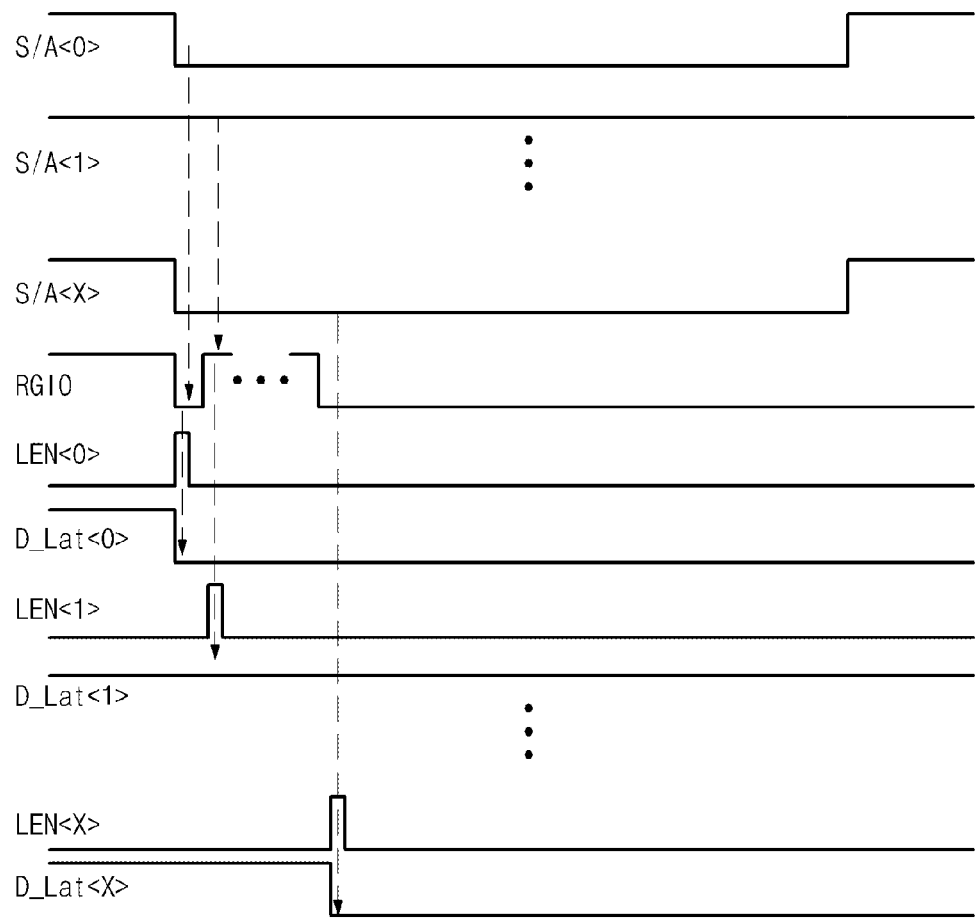
FIG. 4 illustrates an operational timing diagram of a read operation in a conventional nonvolatile memory device.
Figure 5:
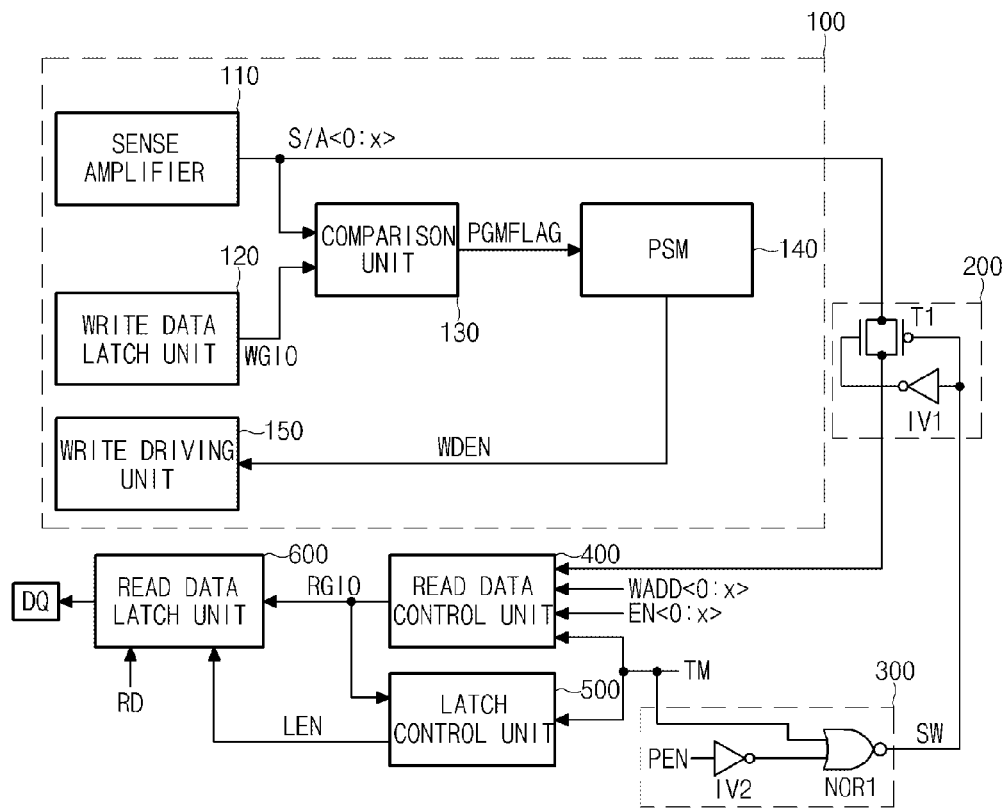
FIG. 5 illustrates a semiconductor device according to an embodiment of the present invention.

FIG. 5 illustrates a semiconductor device according to an embodiment of the present invention.

The semiconductor device includes a program and verification control unit 100, a switching unit 200, a test signal input unit 300, a read data control unit 400, a latch control unit 500, and a read data latch unit 600.

The program and verification control unit 100 includes a sense amplifier 110, a write data latch unit 120, a comparison unit 130, a program state machine (PSM) 140, and a write driving unit 150.

In the above configuration, "a test control unit" refers to a structure including the switching unit 200 and the test signal input unit 300. "A verification read control unit" refers to a structure including the switching unit 200, the test signal input unit 300, the read data control unit 400, and the latch control unit 500.

The sense amplifier 110 senses and amplifies data received from a memory cell array. Specifically, in accordance with an embodiment of the present invention, data received from the sense amplifier 110 is outputted to the switching unit 200. Data received from the sense amplifier 110 is sensed several times through a verification read operation in the read data control unit 400.

For example, in the prior art, a plurality of read data S/A<0>~S/A<X> is respectively sensed by a plurality of sense amplifiers and sequentially stored in a plurality of read data latches. However, in accordance with an embodiment of the present invention, verification read data, e.g., S/A<0>, among the plurality of verification read data, e.g., S/A<0>~S/A<X>, that is output from the sense amplifier 110 is used.

A program and verify read (PNV) operation includes a verification read operation that is performed before a program operation is performed.

The comparison unit 130 compares data written in a current cell with write data to be written in the current cell. The write data are inputted from the write data latch unit 120 through a write global input/output line WGIO, and the comparison unit 130 receives verification read data S/A<0:X> from the sense amplifier 110.

If the write data to be written is identical to the verification read data S/A<0:X> written in the current cell, the comparison unit 130 disables a program flag signal PGMFLAG. The PSM 140 for controlling the program operation disables a write control signal WDEN in response to the disabled program flag signal PGMFLAG. When the write control signal WDEN is disabled, the write driving unit 150 does not operate, so that the program operation is not performed.

The write driving unit 150 is controlled by the write control signal WDEN and controls a driving voltage that is supplied to the memory cell array in the program operation.

On the other hand, if the write data to be written is different from the verification read data S/A<0:X> written in the current cell, the comparison unit 130 enables the program flag signal PGMFLAG.

The PSM 140 enables the write control signal WDEN in response to the enabled program flag signal PGMFLAG. When the write control signal WDEN is enabled, the write driving unit 150 operates to perform the program operation.

The switching unit 200 includes a transmission gate T1 and an inverter IV1. The inverter IV1 inverts an output signal of the test signal input unit 300 and outputs an inverted output signal. The transmission gate T1 is switched in response to the output signal of the test signal input unit 300 and the inverted output signal from the inverter IV1 to selectively output the verification read data S/A<0> to the read data control unit 400.

The test signal input unit 300 includes an inverter IV2 and a NOR gate NOR1. The inverter IV2 inverts a program enable signal PEN. The NOR gate NOR1 performs a NOR operation on a test signal TM and an output signal of the inverter IV2.

In the verification read operation, the test signal TM has a high level. Accordingly, regardless of activation of the program enable signal PEN, a switching signal SW that is an output signal of the test signal input unit 300 has a low level and thus turns on the transmission gate T1 in the switching unit 200.

In the program operation, the program enable signal PEN has a high level. In this case, when the test signal TM has a high level, the switching signal SW output from the NOR gate NOR1 has a low level and thus turns on the transmission gate T1 in the switching unit 200. On the other hand, when the test signal TM has a low level, the switching signal SW has a high level and thus turns off the transmission gate T1 in the switching unit 200.

The read data control unit 400 receives write addresses WADD<0:X>, the test signal TM, enable signals EN<0:X>, and the verification read data S/A<0>.

The read data control unit 400 selects one verification read data S/A<0> from the verification read data S/A<0:X> applied through the switching unit 200 depending on the write addresses WADD<0:X> during an activation period of the test signal TM. The read data control unit 400 senses the verification read data S/A<0> several times in response to the enable signals EN<0:X> to sequentially output the data into a global input/output line RGIO.

The latch control unit 500 sequentially outputs latch enable signals LEN, which correspond to the data applied to the global input/output line RGIO during the activation period of the test signal TM, to the read data latch unit 600.

The read data latch unit 600 includes a plurality of data latches to store the verification read data S/A<0> applied to the global input/output line RGIO in the plurality of data latches sequentially in response to the latch enable signals LEN. The verification read data stored in the read data latch unit 600 is outputted to an external data output unit DQ in response to a read command RD.

Figure 6:
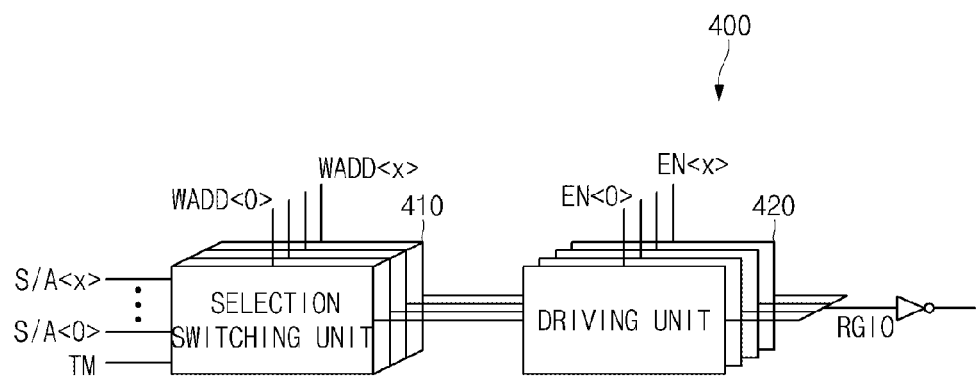
FIG. 6 illustrates a detailed block diagram of the read data control unit in FIG. 5.

FIG. 6 illustrates a block diagram of the read data control unit 400 in FIG. 5.

The read data control unit 400 includes a selection switching unit 410 and a driving unit 420.

The selection switching unit 410 selects one verification read data S/A<0> from the plurality of verification read data S/A<0:X> depending on the write addresses WADD<0:X> during the activation period of the test signal TM.

The driving unit 420 senses the verification read data S/A<0> several times in response to the plurality of enable signals EN<0:X> to sequentially output the sensed data to the global input/output line RGIO. The plurality of enable signals EN<0:X> are sequentially enabled in response to a clock CLK (not shown).

Figure 7:
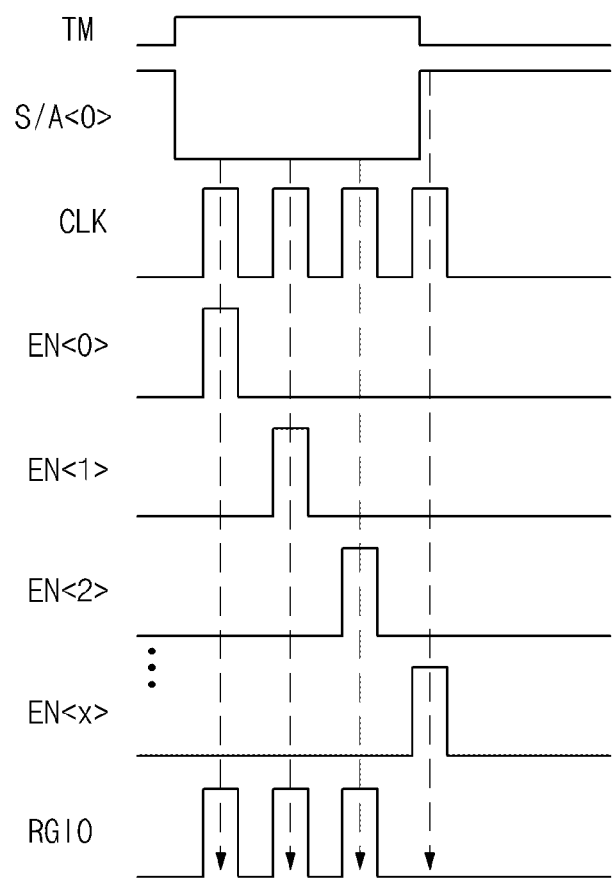
FIG. 7 illustrates an operational timing diagram of the read data control unit in FIG. 6.

FIG. 7 illustrates an operational timing diagram of the read data control unit 400 in FIG. 6.

The selection switching unit 410 receives the write addresses WADD<0:X> while the test signal TM is activated to a high level. Depending on the write address selected from the write addresses WADD<0:X>, the selection switching unit 410 selects one verification read data S/A<0> from the plurality of verification read data S/A<0:X>.

The plurality of enable signals EN<0:X> inputted to the driving unit 420 are sequentially activated in synchronization with the clock CLK. The driving unit 420, in synchronization with the plurality of sequentially activated enable signals EN<0:X>, senses the verification read data S/A<0> several times and sequentially outputs the sensed data to the global input/output line RGIO.

Figure 8:
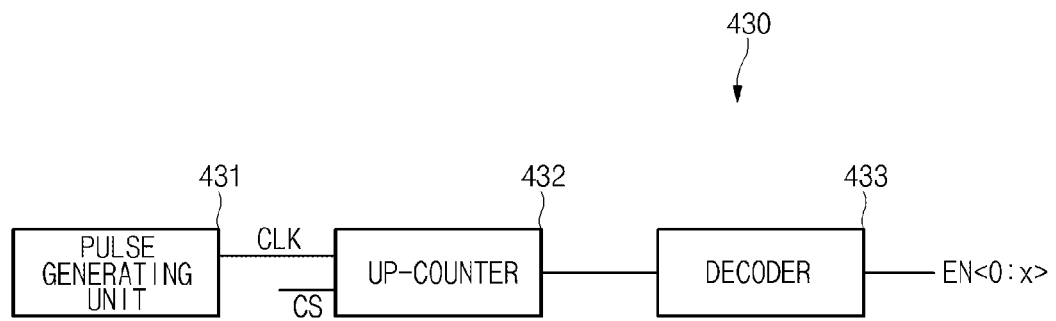
FIG. 8 illustrates a block diagram of an enable signal generating unit.

FIG. 8 illustrates a block diagram of an enable signal generating unit 430 for generating the plurality of enable signals EN<0:X>.

The enable signal generating unit 430 includes a pulse generating unit 431, an up-counter 432, and a decoder 433.

The pulse generating unit 431 generates a clock CLK with a certain cycle. The up-counter 432, in synchronization with the clock CLK, performs an up-count operation on a counter start signal CS. The counter start signal CS may start from a logical state of "0."

The decoder 433 decodes an output signal of the up-counter 432 to output the plurality of enable signals EN<0:X>.

Figure 9:
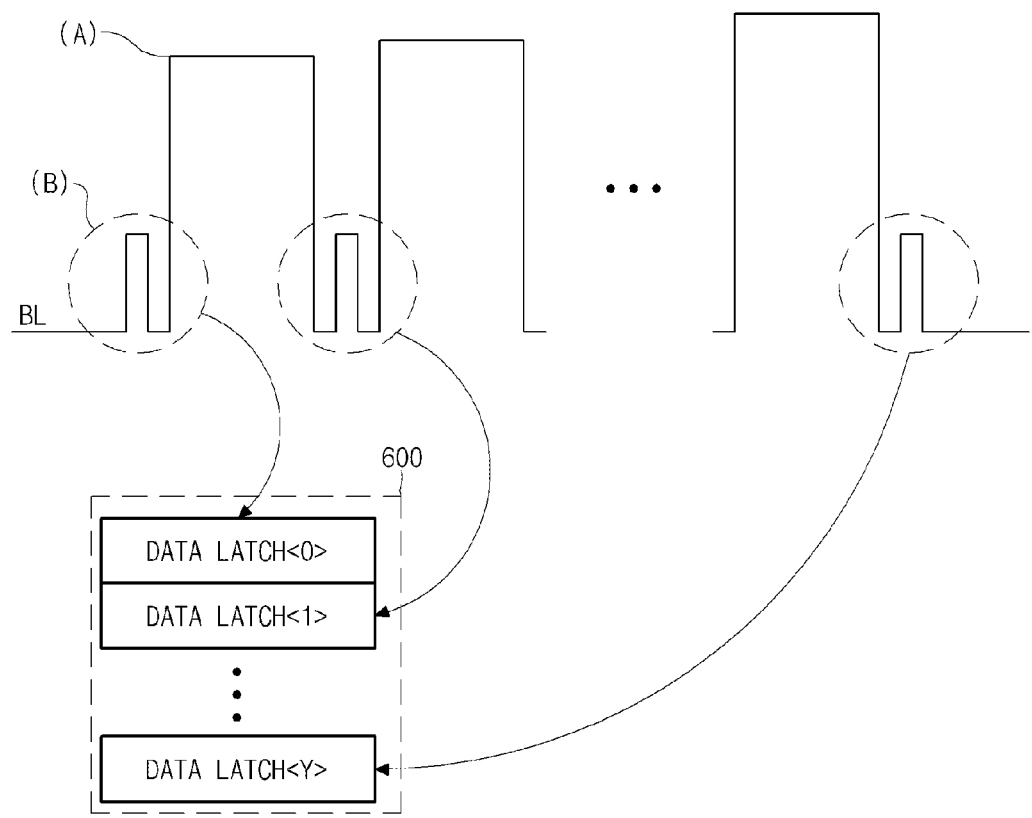
FIG. 9 illustrates a verification read operation of a semiconductor device according to an embodiment of the present invention.

FIG. 9 illustrates a verification read operation of a semiconductor device according to an embodiment of the present invention.

As illustrated in FIG. 9, in accordance with an embodiment of the present invention, the verification read data S/A<0> sensed in the sense amplifier 110 is detected several times, as indicated by (B). That is, the verification read data S/A<0> is sensed several times while a voltage level of a program pulse (A) rises gradually.

The verification read data S/A<0> is detected several times in activation of the test signal TM, and detected values of the verification read data S/A<0> are sequentially stored in a plurality of data latches of the data latch unit 600.

Since values stored in the data latch unit 600 can be outputted through the external data output unit DQ to an external device (not shown), the external device can determine data values sensed in the verification read operation.

Figure 10:
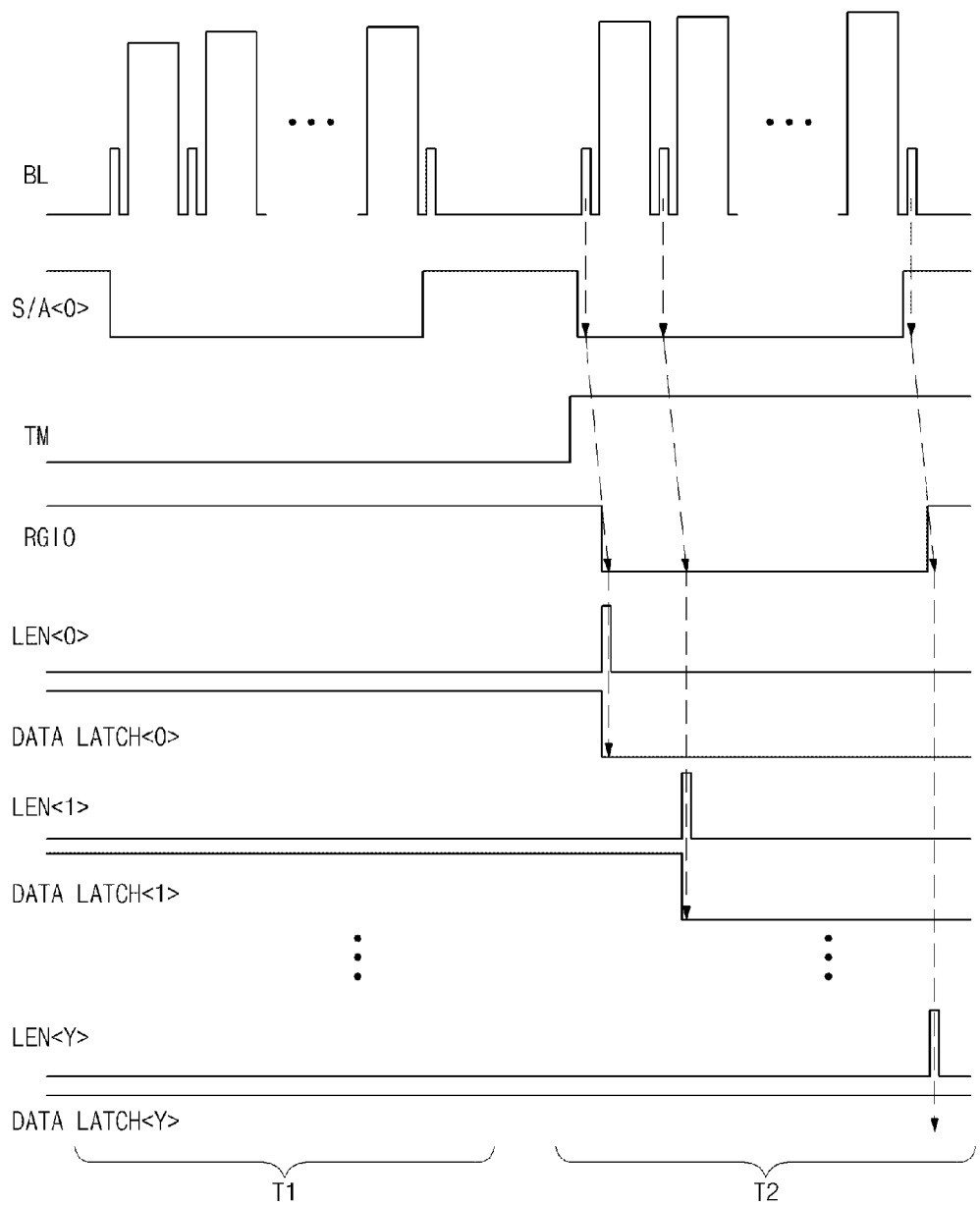
FIG. 10 illustrates a timing diagram for a method for operating a semiconductor device according to an embodiment of the present invention.

FIG. 10 illustrates a timing diagram of a method for sensing a semiconductor device according to an embodiment of the present invention.

A time period T1 represents a normal program period, and a time period T2 represents a test mode period.

During the time period T1, i.e., the normal program period, the program enable signal PEN has a high level, and the test signal TM has a low level. Accordingly, the switching signal SW, which is an output signal of the test signal input unit 300, has a high level and thus turns off the switching unit 200. As a result, in a normal program operation, the verification read data S/A<0> is not outputted to the read data control unit 400, so that a read operation is not performed.

Therefore, in the normal program operation, the global input/output line RGIO maintains a high level because data is not transmitted thereto, and all of the latch enable signals LEN maintain a low level.

During the time period T2, i.e., the test mode period, the program enable signal PEN has a low level and the test signal TM has a high level. Accordingly, the switching signal SW has a low level and thus turns on the switching unit 200.

As a result, in a verification read operation, the verification read data S/A<0> outputted from the sense amplifier 110 is outputted to the read data control unit 400 to perform the verification read operation. The verification read data S/A<0> sensed by the sense amplifier 110 is detected several times. That is, the verification read data S/A<0> is sensed several times while a voltage level of a program pulse rises gradually.

The read data control unit 400 sequentially outputs the verification read data S/A<0> that is detected several times to the global input/output line RGIO during the test mode period.

In a normal read operation, since several sensing data that are previously stored in the read data control unit 400 are outputted to the global input/output line RGIO, the stored data can be transmitted into the global input/output line RGIO regardless of the timing.

However, in an embodiment of the present invention, since the verification read data S/A<0> sensed several times by the sense amplifier 110 is outputted to the global input/output line RGIO, a timing control is required to detect variation in the verification read data S/A<0> when the verification read operation is performed.

While the test signal TM is being activated, the latch control unit 500 sequentially outputs latch enable signals LEN<0>~LEN<Y> in synchronization with the points in time when each sensed value of the verification read data S/A<0> is outputted to the global input/output line RGIO.

In response to the latch enable signals LEN<0>~LEN<Y>, the read data latch unit 600 stores data applied to the global input/output line RGIO in order of verification read in the data latches therein.

As described above, the semiconductor device according to an embodiment of the present invention may output verification read data values during the program and verification operations using the test mode. As a result, an external device can recognize the verification read data during the program and verification operations, so that it is easy to determine if there is a defect in the verification read operation. Moreover, since the program operation is stopped at a point in time when the verification read data changes, it is easy to find out how many times the program and verification operations are performed.

Although a number of illustrative embodiments consistent with the present invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A verification read data output circuit of a semiconductor device, comprising:
    a verification read control unit configured to output a plurality of verification read data values, which are sequentially received from one of a plurality of sense amplifiers, to a global input/output line in response to a test signal; and
    a read data latch unit configured to sequentially store the verification read data values received from the global input/output line in response to latch enable signals that are sequentially enabled during an activation period of the test signal,
    wherein the verification read control unit comprises:
        a test control unit configured to selectively output the verification read data values depending on the activation of the test signal;
        a read data control unit configured to output the verification read data values to the global input/output line during the activation period of the test signal; and
        a latch control unit configured to output the latch enable signals.

2. The verification read data output circuit according to claim 1, wherein the test control unit is configured to output the verification read data values to the read data control unit regardless of the activation of a program enable signal if the test signal is activated.

3. The verification read data output circuit according to claim 2, wherein the test control unit comprises:
   a test signal input unit configured to enable a switching signal if the test signal is activated, regardless of the activation of the program enable signal; and
   a switching unit configured to output the verification read data values to the read data control unit when the switching signal is enabled.

4. The verification read data output circuit according to claim 1, wherein the read data control unit is configured to sequentially output the verification read data values to the global input/output line.

5. The verification read data output circuit according to claim 1, wherein the read data control unit comprises:
   a selection switching unit configured to select the plurality of verification read data values among verification read data values received from the plurality of sense amplifiers depending on a write address during the activation period of the test signal; and
   a driving unit configured to sequentially output the verification read data values output from the selection switching unit to the global input/output line in synchronization with a plurality of enable signals that are sequentially activated.

6. The verification read data output circuit according to claim 5, further comprising an enable signal generating unit configured to supply the plurality of enable signals to the read data control unit.

7. The verification read data output circuit according to claim 6, wherein the enable signal generating unit comprises:
   a pulse generating unit configured to generate a clock with a given cycle;
   an up-counter configured to perform an up-count operation on a counter start signal in synchronization with the clock; and
   a decoder configured to decode an output signal of the up-counter to generate the plurality of enable signals.

8. The verification read data output circuit according to claim 1, wherein the latch control unit is configured to output the latch enable signals in synchronization with a point in time when each of the verification read data values is outputted to the global input/output line.

9. The verification read data output circuit according to claim 1, wherein the read data latch unit is configured to output data stored therein to an external device through a data output unit in response to a read command.

10. The verification read data output circuit according to claim 1, wherein, when the plurality of verification read data values is sensed by the sense amplifier, a voltage level of a program pulse supplied to the semiconductor device rises gradually.

11. A method for operating a verification read data output circuit of a semiconductor device, the method comprising:
   verifying data supplied to a sense amplifier to output a data value of target verification read data;
   outputting the data value of the target verification read data to a global input/output line during an activation period of a test signal; and
   storing the data value of the target verification read data output to the global input/output line in a read data latch unit in response to a latch enable signal during the activation period of the test signal,
   wherein the above steps are repeated to store a plurality of data values of the target verification read data from the sense amplifier in the read data latch unit, and
   wherein the plurality of data values of the target verification read data are outputted to the global input/output line if the test signal is activated, regardless of the activation of a program enable signal.

12. The method according to claim 11, further comprising outputting data stored in the read data latch unit to an external device through a data output unit in response to a read command.

13. The method according to claim 11, wherein the plurality of data values of the target verification read data received from the sense amplifier are sequentially outputted to the global input/output line during the activation period of the test signal.

14. The method according to claim 11, further comprising:
   selecting one of a plurality of verification read data, which are sensed by a plurality of sense amplifiers, as the target verification read data depending on a write address during the activation period of the test signal; and
   outputting data values of the selected verification read data to the global input/output line in synchronization with a plurality of enable signals that are sequentially activated.

15. The method according to claim 14, further comprising:
   generating a clock with a given cycle;
   performing an up-count operation on a counter start signal in synchronization with the clock; and
   decoding the up-counted signal to generate the plurality of enable signals.

16. The method according to claim 11, wherein the latch enable signals are sequentially activated in synchronization with a point in time when each data value of the target verification read data is outputted to the global input/output line.

17. The method according to claim 11, wherein the outputting of the data value of the target verification read data comprises:
   enabling a switching signal if the test signal is activated, regardless of the activation of the program enable signal; and
   outputting the data value of the target verification read data to the global input/output line if the switching signal is enabled.

18. The method according to claim 11, wherein, when the plurality of data values of the target verification read data is sensed by the sense amplifier, a voltage level of a program pulse supplied to the semiconductor device rises gradually.

* * * * *